United States Patent
Lee et al.

(10) Patent No.: US 7,224,314 B2
(45) Date of Patent: May 29, 2007

(54) DEVICE FOR REFLECTING ELECTROMAGNETIC RADIATION

(75) Inventors: Gregory Steven Lee, Mountain View, CA (US); Robert C. Taber, Palo Alto, CA (US); John Stephen Kofol, Sunnyvale, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 49 days.

(21) Appl. No.: 10/997,422

(22) Filed: Nov. 24, 2004

(65) Prior Publication Data

US 2006/0109176 A1 May 25, 2006

(51) Int. Cl.
*H01Q 1/38* (2006.01)
(52) U.S. Cl. .................. 343/700 MS; 343/700 MS
(58) Field of Classification Search .......... 343/700 MS
See application file for complete search history.

(56) References Cited

U.S. PATENT DOCUMENTS

| | | | |
|---|---|---|---|
| 4,150,382 A | 4/1979 | King | |
| 4,885,592 A | 12/1989 | Kofol et al. ............ | 343/754 |
| 5,268,696 A | 12/1993 | Buck et al. | |
| 5,877,726 A * | 3/1999 | Kudoh et al. ......... | 343/700 MS |
| 5,903,239 A * | 5/1999 | Takahashi et al. ... | 343/700 MS |
| 6,384,792 B2 * | 5/2002 | Apostolos ............ | 343/744 |
| 6,384,797 B1 | 5/2002 | Schaffner et al. | |
| 6,486,511 B1 * | 11/2002 | Nathanson et al. ......... | 257/328 |
| 6,642,889 B1 | 11/2003 | McGrath | |
| 6,809,688 B2 * | 10/2004 | Yamada ............... | 343/700 MS |
| 2002/0011955 A1 * | 1/2002 | Apostolos ............ | 343/700 MS |

FOREIGN PATENT DOCUMENTS

| | | |
|---|---|---|
| GB | 2237936 | 5/1991 |
| WO | WO 2004/021508 | 3/2004 |

OTHER PUBLICATIONS

P. M. Backhouse et al—"Antenna-Coupled Microwave Phase Shifters Using GaAs Varactors"; Electronic Letters, IEE Stevenage, GB; vol. 27, No. 6, Mar. 14, 1991; pp. 491-492, XP000225079, ISSN: 0013-5194.
European Search Report dated Feb. 3, 2006.

* cited by examiner

Primary Examiner—Hoang V. Nguyen
Assistant Examiner—Dieu Hien Duong

(57) ABSTRACT

A reflectarray utilizes switching devices with non-ideal impedance characteristics to vary the impedance of reflecting elements. The antennas of the reflecting elements are configured as a function of the impedance of the non-ideal switching devices to provide optimal phase-amplitude performance. In particular, the antennas are configured such that the impedance of each antenna is proportional to the square root of the impedance of the non-ideal switching devices when in an on state and when in an off state.

20 Claims, 2 Drawing Sheets

DEVICE FOR REFLECTING ELECTROMAGNETIC RADIATION

BACKGROUND OF THE INVENTION

Microwave and millimeter-wave reflectarrays are antenna arrays in which each antenna is connected to a variable impedance device. If the variable impedance device is a resistive device, ideally it is biased at either short-circuit or open-circuit states or at least at states of very low or very high resistance compared to the antenna impedance. In this way, the antenna and variable impedance device combination acts as a variable-phase reflecting element. With appropriate control signals applied to the variable impedance devices, the reflectarray can be used as an adjustable mirror with the capability of focusing, steering, or splitting a beam of electromagnetic radiation.

Diodes have typically been used as the variable impedance devices in reflectarrays although transistors have also been used. Many low cost transistors are able to provide the desired impedance characteristics at relatively low radio frequency ranges (e.g., less than 10 GHz). However, these low cost transistors do not necessarily provide the desired impedance performance characteristics at relatively high radio frequency ranges (e.g., greater than 20 GHz). More expensively packaged transistors as well as more exotic devices, such as ferroelectric capacitors and ferrite switches, are readily able to provide the desired impedance characteristics at the higher frequency ranges, but the number of transistors, capacitors, or switches required for many reflectarray applications combined with the high cost of each packaged device makes reflectarrays with such devices prohibitively expensive.

In view of this, what is needed is a reflectarray that exhibits the desired impedance characteristics and that is economical to implement.

SUMMARY OF THE INVENTION

A reflectarray utilizes switching devices with non-ideal impedance characteristics to vary the impedance of reflecting elements. The antennas of the reflecting elements are configured as a function of the impedance of the non-ideal switching devices to provide optimal phase-amplitude performance. In particular, the antennas are configured such that the impedance of each antenna is proportional to the square root of the impedance of the non-ideal switching devices when in an on state and when in an off state. Configuring the antennas as a function of the impedance of the non-ideal switching devices enables a reflectarray to achieve switching between 0 and 180 degree phase-amplitude states while utilizing low-cost switching devices, such as surface mount field effect transistors, which exhibit non-ideal impedance characteristics over the operating frequency range of the reflectarray.

Other aspects and advantages of the present invention will become apparent from the following detailed description, taken in conjunction with the accompanying drawings, illustrating by way of example the principles of the invention.

BRIEF DESCRIPTION OF THE DRAWINGS

Throughout the description similar reference numbers are used to identify similar elements.

DETAILED DESCRIPTION

A reflectarray utilizes switching devices with non-ideal impedance characteristics to vary the impedance of reflecting elements. The antennas of the reflecting elements are configured as a function of the impedance of the non-ideal switching devices to provide optimal phase-amplitude performance. In particular, the antennas are configured such that the impedance of each antenna is proportional to the square root of the impedance of the non-ideal switching devices when in an on state and when in an off state.

Figure 1:
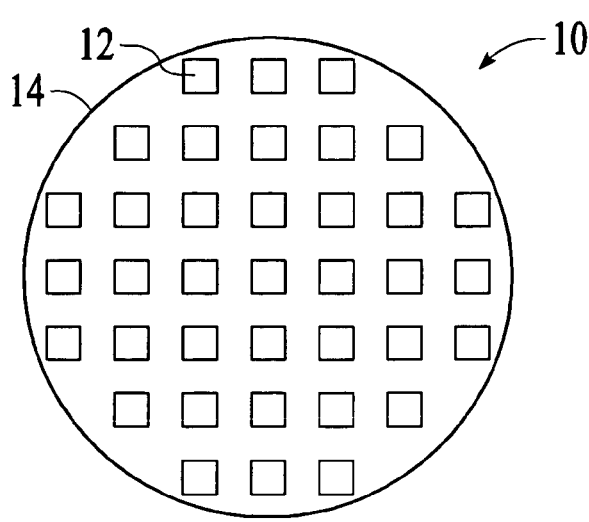
FIG. 1 depicts an example of a reflectarray for microwave and millimeter-wave applications.

Reflectarrays are passive systems that reflect externally provided electromagnetic radiation. FIG. 1 depicts an example of a reflectarray 10 for microwave and millimeter-wave applications. The reflectarray includes distinct reflecting elements 12 that reflect electromagnetic radiation with varying phase depending on their impedance state. Ideally, the reflecting elements reflect electromagnetic radiation with a phase shift of 180 degrees when their impedance is high relative to when their impedance is low. The reflecting elements are individually controllable and the reflectarray is typically supported by driver electronics (not shown in FIG. 1). The reflectarray is formed on and/or in a substrate 14 such as a printed circuit board. In one example, the reflectarray has a surface area of approximately one meter square and is covered with 10,000 to 100,000 individually controllable reflecting elements.

Figure 2:
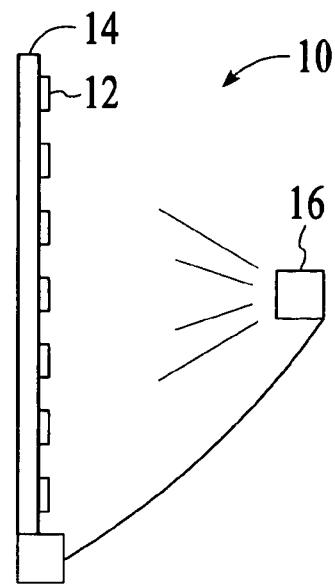
FIG. 2 depicts a side view of a reflectarray and a horn that provides electromagnetic radiation to the reflectarray.

Electromagnetic radiation can be provided to the reflectarray from a source such as a horn. FIG. 2 depicts a side view of a reflectarray 10 and a horn 16 that is configured to provide electromagnetic radiation to the reflectarray. Although a horn is shown as the source of the electromagnetic radiation in FIG. 2, other sources of electromagnetic radiation are possible.

Figure 3:
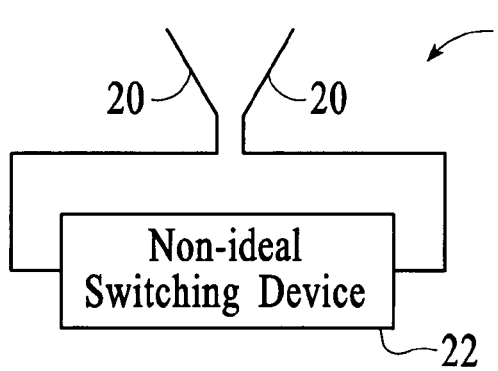
FIG. 3 depicts a functional design of one of the individual reflecting elements of the reflectarray from FIG. 1, which includes an antenna and a non-ideal switching device in accordance with an embodiment of the invention.

FIG. 3 depicts a functional design of one of the individual reflecting elements 12 from FIG. 1. The reflecting element includes an antenna 20 and a non-ideal switching device 22. The antenna functions to absorb or reflect a beam of electromagnetic radiation to varying degrees depending on the impedance level of the reflecting element. The antenna is represented here as a generic dipole antenna for description purposes although other types of antennas are contemplated. Example antenna types that can be incorporated into a reflectarray include patch, dipole, monopole, loop, and dielectric resonator type antennas. In reflectarray applications, the antennas are often formed in a single plane on the surface of the reflectarray substrate. The antennas have an impedance characteristic that is a function of the antenna design parameters. Design parameters of antennas include but are not limited to, physical attributes such as the dielectric material of construction, the thickness of the dielectric material, shape of the antenna, length and width of the antenna, feed location, and thickness of the antenna metal layer.

The non-ideal switching device 22 changes the impedance state of the reflecting element 22 by changing its resistive state. A low resistive state (e.g., a closed or "short" circuit) translates to a low impedance. Conversely, a high resistive state (e.g., an open circuit) translates to a high impedance. A switching device with ideal performance characteristics (referred to herein as an "ideal" switching device) produces effectively zero impedance (Z=0) when its resistance is at its lowest state and effectively infinite impedance (Z=∞) when its resistance is at its highest state. As described herein, a switching device is "on" when its impedance is at its lowest state (e.g., $Z_{on}=0$) and "off" when its impedance is at its highest state (e.g., $Z_{off}=\infty$). Because the on and off impedance states of an ideal switching device are effectively $Z_{on}=0$ and $Z_{off}=\infty$, an ideal switching device is able to provide the maximum phase shift without absorption of electromagnetic radiation between the on and off states. That is, the ideal switching device is able to provide switching between 0 and 180 degree phase states. In the case of an ideal switching device, maximum phase-amplitude performance can be achieved with an antenna that exhibits any finite non-zero impedance.

In contrast to an ideal switching device, a "non-ideal" switching device is a switching device that does not exhibit on and off impedance states of $Z_{on}=0$ and $Z_{off}=\infty$, respectively. Rather, the on and off impedance states of a non-ideal switching device are somewhere between $Z_{on}=0$ and $Z_{off}=\infty$. A non-ideal switching device may exhibit ideal impedance characteristics within certain frequency ranges (e.g., <10 GHz) and highly non-ideal impedance characteristics at other frequency ranges (e.g., >20 GHz).

Because the on and off impedance states of a non-ideal switching device are somewhere between $Z_{on}=0$ and $Z_{off}=\infty$, the non-ideal switching device does not necessarily provide the maximum phase state performance regardless of the impedance of the corresponding antenna, where maximum phase state performance involves switching between 0 and 180 degree phase states. In accordance with the invention, the antennas of a reflectarray that utilizes non-ideal switching devices are specifically designed to provide optimal phase performance, where the optimal phase state performance of a reflecting element is the point at which the reflecting element is closest to switching between 0 and 180 degree phase-amplitude states. In an embodiment, to achieve optimal phase state performance, the antennas are configured as a function of the impedance of the non-ideal switching devices. For example, the antennas are designed such that the impedance of the antennas is a function of impedance characteristics of the non-ideal switching devices. Further, the antennas are configured as a function of the impedance of the non-ideal switching devices in the on state, $Z_{on}$, and the impedance of the non-ideal switching device in the off state, $Z_{off}$. In a particular embodiment, the phase state performance of a reflecting element is optimized when the antennas are configured such that the impedance of each antenna is conjugate to the square root of the impedance of the non-ideal switching devices when in the on and off impedance states, $Z_{on}$ and $Z_{off}$. Specifically, the impedance of each antenna is the complex conjugate of the geometric mean of the on and off impedance states, $Z_{on}$ and $Z_{off}$, of the corresponding non-ideal switching device. This relationship is represented as:

$$Z_{antenna}^* = \sqrt{Z_{on}Z_{off}} \qquad (1)$$

The above-described relationship is derived using the well-known formula for the complex reflection coefficient between a source impedance and a load impedance. Choosing the source to be the antenna and the load to be the non-ideal switching device, the on-state reflection coefficient is set to be equal to the opposite of the off-state reflection coefficient to arrive at equation (1).

Designing an antenna that exhibits optimal phase-amplitude performance involves determining the on and off impedances, $Z_{on}$ and $Z_{off}$ of the particular non-ideal switching device that is used in the reflecting elements. Design parameters of the antenna are then manipulated to produce an antenna with an impedance that matches the relationship expressed in equation (1) above. An antenna that satisfies equation (1) can be designed as long as $Z_{on}$ and $Z_{off}$ are determined to be distinct values.

Figure 4:
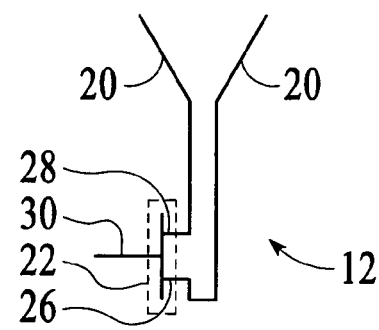
FIG. 4 depicts a functional diagram of a reflecting element in which a three-terminal solid-state transistor is used as the non-ideal switching device in accordance with an embodiment of the invention.

Types of switching devices that exhibit non-ideal impedance characteristics over the frequency band of interest include low cost surface mount devices such as surface mount field effect transistors (FETs) and surface mount diodes. Although surface mount FETs exhibit non-ideal impedance characteristics over the frequency band of interest, they are relatively inexpensive and can be individually packaged for use in reflectarray applications. FIG. 4 depicts a functional diagram of a reflecting element 12 in which a three-terminal solid-state transistor is used as the non-ideal switching device 22. In particular, the three-terminal solid-state transistor is a FET with a source 26, a drain 28, and a gate 30. The source and drain are connected to opposite terminals of the antenna 20 and the drain is connected to some driver electronics (not shown). In an embodiment, the source is DC-grounded and the drain is either DC-grounded or floating, depending on the application. For an enhancement-mode FET, the source-drain radio frequency impedance is nominally high when the gate-source voltage $V_{gs}$ is zero or negative and low when $V_{gs}$ is sufficiently positive. For a depletion-mode FET, the source-drain radio frequency impedance is nominally low when $V_{gs}$ is zero or positive and high when $V_{gs}$ is sufficiently negative. Although FIGS. 3 and 4 represent functional connections between the antenna and the non-ideal switching device, as is described in detail below, these figures may not exactly represent the physical connections between the antenna and the non-ideal switching device in an actual implementation.

Figure 5:
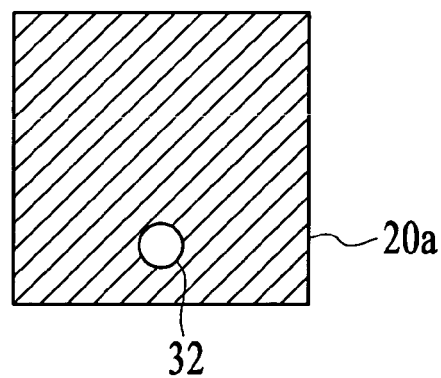
FIG. 5 depicts a top view of a planar patch antenna.

In an embodiment, the antennas 20 in the reflectarray 10 are planar patch antennas. FIG. 5 depicts an example of a top view of a planar patch antenna 20a. The planar patch antenna includes a via connector 32 that is electrically connected to the drain of a corresponding solid-state transistor. Design criteria of the planar patch antenna that affect the antenna's impedance include, for example, dielectric material of construction, thickness of the dielectric, width of the patch, feed point, and planar metal thickness. In an embodiment, the planar patch antenna is formed by depositing a metal layer (e.g., gold) on the surface of the reflectarray substrate.

Figure 6:
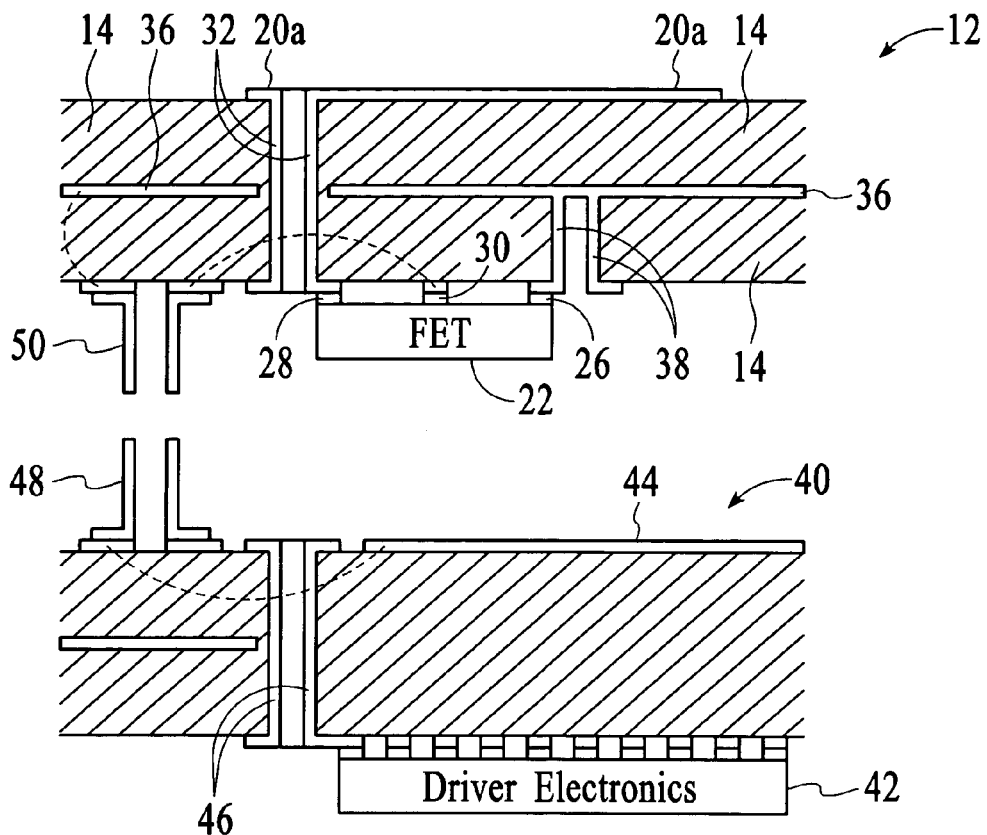
FIG. 6 depicts a side view of a reflecting element that utilizes a surface mounted field effect transistor as the non-ideal switching device in accordance with an embodiment of the invention.

Scalability and cost of a reflectarray depend critically on packaging and assembly both at the component level and at the system level. FIG. 6 depicts a side view of a reflecting element 12 that utilizes a surface mounted FET as the non-ideal switching device. The reflecting element of FIG. 6 is formed on and in a printed circuit board substrate 14 and includes the surface mounted FET 22, a patch antenna 20a, a drain via 32, a ground plane 36, and a source via 38. The surface mounted FET is mounted on the opposite side of the printed circuit board substrate as the planar patch antenna and the ground plane is located between the planar patch antenna and the surface mounted FET. The drain via 32 connects the drain 28 of the surface mounted FET to the planar patch antenna 20a and the source via 38 connects the source 26 of the surface mounted FET 22 to the ground plane 36. In one embodiment, the surface mounted FETs are placed on the printed circuit board substrate using a robotic "pick and place" process and then wave soldered to the printed circuit board.

In a working product, the reflectarray is connectable to a controller board 40 that includes driver electronics. An example controller board is also depicted in FIG. 6 and includes a ground plane 44, a drive signal via 46, and driver electronics 42. The controller board also includes connectors 48 that are compatible with connectors 50 of the reflectarray. The connectors of the two boards can be connected to each other, for example, using wave soldering.

Figure 7:
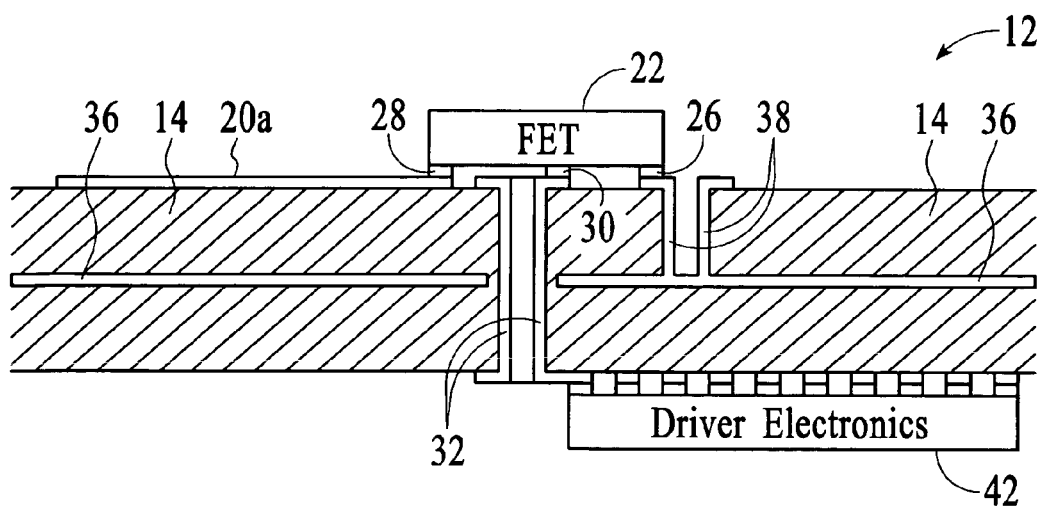
FIG. 7 depicts a side view of another embodiment of a reflecting element that utilizes a surface mounted field effect transistor as the non-ideal switching device in accordance with an embodiment of the invention.

FIG. 7 depicts a side view of another embodiment of a reflecting element 12 that utilizes a surface mounted FET 22 as the non-ideal switching device. This embodiment is similar to the embodiment of FIG. 7 except that the FET is surface mounted on the same side of the printed circuit board substrate 14 as the planar patch antenna 20a. Additionally, the driver electronics 42 can be soldered directly to the same printed circuit board in which the reflecting element is built.

In a reflectarray that utilizes FETs as the non-ideal switching devices, the beam-scanning speed that can be achieved depends on a number of factors including signal-to-noise ratio, crosstalk, and switching time. In the case of a FET, the switching time depends on gate capacitance, drain-source capacitance, and channel resistance (i.e., drain-source resistance). The channel resistance is actually space-dependent as well as time-dependent. In order to minimize the switching time between impedance states, the drain of the FET is DC-shorted at all times. The drain is DC-shorted at all times because floating the drain presents a large off-state channel resistance as well as a large drain-source capacitance due to the huge parallel-plate area of the patch antenna. This implies that the antenna is DC-shorted but one wishes the only "rf short" the antenna sees be at the source. Therefore, the additional antenna/drain short must be optimally located so as to minimally perturb the antenna.

Although solid-state transistors are described herein as the non-ideal switching devices, other non-ideal switching devices may be used. Although the reflectarray is described in terms of applications in the microwave and millimeter wave spectrums, the reflectarray could be used with other spectrum bands of electromagnetic radiation.

Although specific embodiments in accordance with the invention have been described and illustrated, the invention is not limited to the specific forms and arrangements of parts so described and illustrated. The invention is limited only by the claims.

What is claimed is:

1. A device for reflecting electromagnetic radiation, the device comprising:
   an array of reflecting elements, each reflecting element comprising:
   an antenna; and
   a non-ideal switching device in electrical signal communication with the antenna;
   wherein the antennas are configured as a function of the impedance of the non-ideal switching devices.

2. The device of claim 1 wherein physical attributes of the antennas are configured as a function of the impedance of the non-ideal switching devices.

3. The device of claim 1 wherein the antennas are configured as a function of the impedance of the non-ideal switching devices when in an on state ($Z_{on}$) and when in an off state ($Z_{off}$).

4. The device of claim 1 wherein the antennas are configured to have an impedance ($Z_{antenna}$) that is conjugate to the square root of the impedance of the non-ideal switching devices when in an on state ($Z_{on}$) multiplied by the impedance of the non-ideal switching devices when in an off state ($Z_{off}$).

5. The device of claim 1 wherein the non-ideal switching devices are solid-state transistors.

6. The device of claim 1 wherein each antenna has a terminal that is connected to a drain of its corresponding solid-state transistor.

7. The device of claim 1 wherein the antennas are planar patch antennas that are formed on a substrate and wherein the non-ideal switching devices are individually packaged surface mount solid-state transistors.

8. The device of claim 1 wherein the non-ideal switching device exhibits non-ideal on and off impedances at radio frequencies above 20 GHz.

9. A device for reflecting electromagnetic radiation, the device comprising:
   an array of reflecting elements, each reflecting element comprising:
   an antenna; and
   a solid-state transistor in electrical signal communication with the antenna;
   wherein the antennas are configured as a function of impedance characteristics of the solid-state transistors.

10. The device of claim 9 wherein the solid-state transistors exhibit non-ideal on and off impedances at radio frequencies above 20 GHz.

11. The device of claim 9 wherein physical attributes of the antennas are configured as a function of the impedance of the solid-state transistors when in an on state ($Z_{on}$) and when in an off static ($Z_{off}$).

12. The device of claim 9 wherein the antennas are configured to have an impedance ($Z_{antenna}$) that is conjugate to the square root of the impedance of the switching devices when in an on state ($Z_{on}$) multiplied by the impedance of the switching devices when in an off state ($Z_{off}$).

13. The device of claim 9 wherein each antenna has a terminal that is connected to the drain of its corresponding solid-state transistor.

14. The device of claim 9 wherein the drains of the solid-state transistors are shorted.

15. The device of claim 9 wherein the solid-state transistors are individually packaged and surface mounted to a substrate.

16. The device of claim 9 wherein the antennas are planar patch antennas, each planar patch antenna being electrically connected to the drain of its corresponding solid-slate transistor.

17. The device of claim 9 wherein the planar patch antennas are formed on an insulating substrate tat includes a pound plane, the pound plane being electrically connected to the source of the solid-state transistors.

18. A device for reflecting electromagnetic radiation, the device comprising:
an array of reflecting elements, each reflecting element comprising:
an antenna; and
a non-ideal switching device in electrical signal communication with the antenna;
wherein the antennas are configured to have an impedance ($Z_{antenna}$) that is conjugate to the square root of the impedance of the non-ideal switching devices when in an on state ($Z_{on}$) multiplied by the impedance of the non-ideal switching devices when in an off state ($Z_{off}$) in order to optimize the phase-amplitude performance of the reflecting elements.

19. The device of claim 18 wherein the antennas are planar patch antennas that are formed on a substrate and wherein the non-ideal switching devices are individually packaged surface mount field effect transistors (FETs).

20. The device of claim 19 wherein the PETs exhibit non-ideal on and off impedances at radio frequencies above 20 GHz.

* * * * *

UNITED STATES PATENT AND TRADEMARK OFFICE
CERTIFICATE OF CORRECTION

PATENT NO. : 7,224,314 B2 Page 1 of 1
APPLICATION NO. : 10/997422
DATED : May 29, 2007
INVENTOR(S) : Lee et al.

It is certified that error appears in the above-identified patent and that said Letters Patent is hereby corrected as shown below:

In column 6, line 47, in Claim 11, delete "static" and insert -- state --, therefor.

In column 6, line 64 (Approx.), in Claim 16, delete "solid-slate" and insert -- solid-state --, therefor.

In column 6, line 67 (Approx.), in Claim 17, delete "tat" and insert -- that --, therefor.

In column 7, line 1, in Claim 17, delete "pound" and insert -- ground --, therefor. (First Occurrence)

In column 7, line 1, in Claim 17, delete "pound" and insert -- ground --, therefor. (Second Occurrence)

In column 8, line 9, in Claim 20, delete "PETS" and insert -- FETs --, therefor.

Signed and Sealed this

Twenty-first Day of August, 2007

JON W. DUDAS
*Director of the United States Patent and Trademark Office*